United States Patent
Cannon et al.

(10) Patent No.: US 7,795,679 B2
(45) Date of Patent: Sep. 14, 2010

(54) DEVICE STRUCTURES WITH A SELF-ALIGNED DAMAGE LAYER AND METHODS FOR FORMING SUCH DEVICE STRUCTURES

(75) Inventors: Ethan H. Cannon, Essex Junction, VT (US); Fen Chen, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 12/178,766

(22) Filed: Jul. 24, 2008

(65) Prior Publication Data

US 2010/0019330 A1 Jan. 28, 2010

(51) Int. Cl.
*H01L 31/0392* (2006.01)
*H01L 21/8238* (2006.01)
*H01L 21/336* (2006.01)

(52) U.S. Cl. ............... 257/347; 257/288; 257/348; 257/349; 257/E21.335; 257/E21.448; 257/E21.618; 257/E29.255; 438/199; 438/231; 438/286

(58) Field of Classification Search ............... 257/288, 257/347, 348, 349, E21.335, E21.448, E21.618, 257/E29.255; 438/199, 231, 286
See application file for complete search history.

(56) References Cited

U.S. PATENT DOCUMENTS

| | | | |
|---|---|---|---|
| 4,766,482 A | 8/1988 | Smeltzer et al. | |
| 6,228,694 B1 * | 5/2001 | Doyle et al. | 438/199 |
| 6,362,082 B1 | 3/2002 | Doyle et al. | |
| 6,828,632 B2 * | 12/2004 | Bhattacharyya | 257/347 |
| 7,161,220 B2 | 1/2007 | Cohen et al. | |
| 7,268,022 B2 | 9/2007 | Bhattacharyya | |
| 7,282,414 B2 * | 10/2007 | Lee et al. | 438/286 |
| 7,288,819 B2 | 10/2007 | Bhattacharyya | |
| 2004/0014304 A1 | 1/2004 | Bhattacharyya | |

FOREIGN PATENT DOCUMENTS

JP 08-045869 2/1996

(Continued)

OTHER PUBLICATIONS

Varker, et al., U.S. Statutory Invention Registration H569 Published Jan. 3, 1989 (18 pages).

(Continued)

*Primary Examiner*—Dao H Nguyen
(74) *Attorney, Agent, or Firm*—Wood, Herron & Evans

(57) ABSTRACT

Device structures with a self-aligned damage layer and methods of forming such device structures. The device structure first and second doped regions of a first conductivity type defined in the semiconductor material of a substrate. A third doped region of opposite conductivity type laterally separates the first doped region from the second doped region. A gate structure is disposed on a top surface of the substrate and has a vertically stacked relationship with the third doped region. A first crystalline damage layer is defined within the semiconductor material of the substrate. The first crystalline damage layer has a first plurality of voids surrounded by the semiconductor material of the substrate. The first doped region is disposed vertically between the first crystalline damage layer and the top surface of the substrate. The first crystalline damage layer does not extend laterally into the third doped region.

19 Claims, 4 Drawing Sheets

U.S. PATENT DOCUMENTS

2004/0166624 A1* 8/2004 Dokumaci et al. .......... 438/231
2006/0246680 A1 11/2006 Bhattacharyya
2007/0158779 A1 7/2007 Cannon et al.

FOREIGN PATENT DOCUMENTS

| JP | 11-067682 | 3/1999 |
| JP | 2000-012547 | 4/2000 |
| WO | WO 2006/049834 A | 5/2006 |

OTHER PUBLICATIONS

Bogen, et al., "Reduction of Lateral Parasitic Current Flow by Buried Recombination Layers Formed by High Energy Implantation of C or O into Silicon", Proceedings of the 11th International Conference on Ion Implantation Technology, Jun. 1996, pp. 792 - 795.

Ntsoenzok, et al., "Helium Implant Depth Dependence on Thermal Growth of Nanocavities in Silicon", Proceedings of the 7th International Conference on Solid-State and Integrated Circuits Technology, Publication Date Oct. 2004, vol. 3, pp. 2382- 2386.

Japanese Office Action dated Sep. 28, 2009.

Extended European Search Report dated Jun. 30, 2009.

Japanese Office Action dated Mar. 29, 2010.

* cited by examiner

DEVICE STRUCTURES WITH A SELF-ALIGNED DAMAGE LAYER AND METHODS FOR FORMING SUCH DEVICE STRUCTURES

BACKGROUND

The invention relates generally to semiconductor device fabrication and, in particular, to device structures with improved soft error rate suppression and with integrated strain for enhanced performance, and methods for forming such device structures.

The semiconductor industry has embraced strained silicon as an inexpensive and effective way to improve device performance and conserve power of field effect transistors and other bulk device structures fabricated by complementary metal oxide semiconductor (CMOS) processes. In particular, applying mechanical stress to the channel region of a field effect transistor can modify carrier mobility. One conventional approach is to introduce so-called embedded stressors directly into the device structure that are capable of straining the crystal lattice of the channel region. For example, embedded stressors composed of a silicon-germanium material may be formed directly beneath the source and drain regions of a field effect transistor. The lattice constant of the silicon-germanium material is relatively large in comparison with silicon, which delivers compressive strain to the intervening channel region of the field effect transistor.

Typically, the germanium content in these embedded stressors is limited to a maximum of fifteen atomic percent or less. Increasing the germanium content above this level begins to introduce defects and cause strain relaxation. Furthermore, thermal heat treatments during the device fabrication process also tend to relax the strain imparted by embedded stressors. Consequently, these and other limitations ultimately restrict the utility of embedded silicon-germanium stressors for altering the carrier mobility in bulk CMOS field effect transistors.

Designing bulk CMOS field effect transistors with a high tolerance to latch-up caused by high-energy ionizing radiation has increased in importance for high performance integrated circuits used in space applications, as well as those used in terrestrial environments for military and other high-reliability applications. Impinging high-energy ionizing radiation (e.g., cosmic ray, neutron, proton, alpha) generates electron-hole pairs by ionization of atoms of the host material along its track, which induces latch-up and single event upsets. Because the integrated circuit cannot be easily replaced in space applications, chip failure induced by bulk CMOS devices susceptible to latch-up may prove catastrophic.

Conventionally, a blanket buried recombination layer has been used for the purpose of radiation hardening. The continuous blanket recombination layer reduces charge collection from an event precipitated by ionization radiation, such as cosmic rays, which reduces device sensitivity to latchup and also to single event upsets. However, blanket buried recombination layers potentially damage the channel region of field effect transistors, which may dramatically degrade device performance.

In summary, improved device structures and fabrication methods are needed for bulk CMOS devices, such as field effect transistors, that overcome these and other deficiencies of conventional device structures and fabrication methods by permitting simultaneous improvements in the strain imparted to the device structure and soft error rate suppression.

BRIEF SUMMARY

In an embodiment of the invention, a device structure includes first and second doped regions of a first conductivity type defined in the semiconductor material of a substrate. A third doped region is disposed in the semiconductor material of the substrate laterally between the first and second doped regions. The semiconductor material of the third doped region has a second conductivity type opposite to the first conductivity type. A gate structure, which is disposed on a top surface of the substrate, has a vertically stacked relationship with the third doped region. The device structure further includes a first crystalline damage layer within the semiconductor material of the substrate. The first crystalline damage layer has a first plurality of voids surrounded by the semiconductor material of the substrate. At least a portion of the first doped region is disposed vertically between the first crystalline damage layer and the top surface of the substrate. The first crystalline damage layer does not extend laterally for a significant distance beneath the gate structure. The first and second doped regions may be the source and drain of a field effect transistor and the gate structure may be the gate electrode and gate dielectric of the field effect transistor.

In another embodiment of the invention, a method is provided for fabricating a device structure in a substrate composed of a semiconductor material. The method includes forming first and second doped regions of a first conductivity type in the semiconductor material of the substrate in which the second doped region is laterally separated from the first doped region by a third doped region having a second conductivity type opposite to the first conductivity type. A gate structure is formed on a top surface of the substrate in a vertically stacked relationship with the third doped region. The method further includes forming a first plurality of voids surrounded by the semiconductor material of the substrate to define a first crystalline damage layer that is separated from the top surface of the substrate by at least a portion of the first doped region and that does not extend laterally for a significant distance beneath the gate structure.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
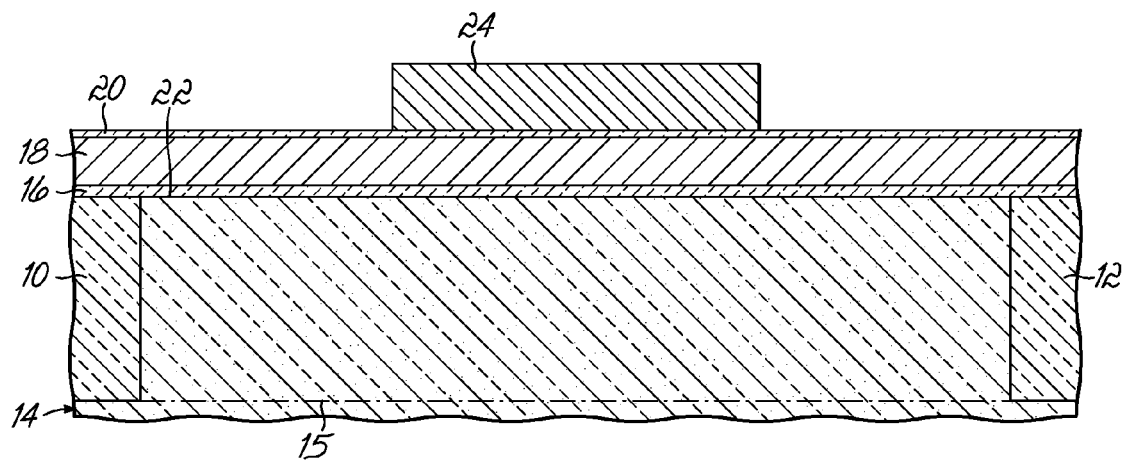
FIGS. 1-5 are diagrammatic cross-sectional views of a portion of a substrate at successive stages of a fabrication process for a device structure in accordance with an embodiment of the invention.

With reference to FIG. 1 and in accordance with an embodiment of the invention, shallow trench isolation regions, of which shallow trench isolation regions 10, 12 are representative, are formed in a substrate 14. The shallow trench isolation regions 10, 12 connect to peripherally encircle a device region of the substrate 14. The shallow trench isolation regions 10, 12 cooperate to electrically isolate one or more devices fabricated in the encircled region of the substrate 14 from adjacent devices.

The dielectric material contained in the shallow trench isolation regions 10, 12 may comprise silicon oxide ($SiO_2$), and can be formed using standard techniques. For example, trenches may be defined in substrate 14 using standard lithography and anisotropic dry etching, filled with dielectric material, such as an oxide like densified tetraethylorthosilicate (TEOS) deposited by thermal chemical vapor deposition (CVD) or a high density plasma (HDP) oxide, and planarized by a conventional chemical mechanical polishing (CMP) process. The planarization removes extraneous dielectric material from the top surface of the substrate 14.

Substrate 14 may be any suitable bulk substrate containing a semiconductor material that a person having ordinary skill in the art would recognize as suitable for forming an integrated circuit. For example, substrate 14 may be composed of a monocrystalline silicon-containing material, such as single crystal silicon with a (100) crystal lattice orientation. The semiconductor material constituting substrate 14 may be lightly doped with an impurity to alter its electrical properties. Specifically, the substrate 14 may be lightly doped with an n-type impurity species to render it initially n-type or lightly doped with a p-type impurity species to render it initially p-type. The device region encircled by the shallow trench isolation regions 10, 12 is defined in a well 15, which may be either an n-well or a p-well depending upon whether the device structure being formed is a p-channel device structure or an n-channel device structure. The well 15 is formed by techniques, such as ion implantation, understood by a person having ordinary skill in the art of CMOS bulk device construction.

A layer stack including a gate dielectric layer 16, a gate conductor layer 18, and a hardmask layer 20 is applied to a top surface 22 of substrate 14. The gate dielectric layer 16, which directly contacts the top surface 22, is disposed between the substrate 14 and the gate conductor layer 18. The gate conductor layer 18, which directly contacts the gate dielectric layer, is disposed between the hardmask layer 20 and the gate dielectric layer 16.

The gate dielectric layer 16 may be composed of any suitable dielectric or insulating material including, but not limited to, $SiO_2$, silicon oxynitride ($SiO_xN_y$), silicon nitride ($Si_3N_4$), a high-k dielectric like hafnium oxide ($HfO_2$), hafnium oxynitride (HfSiON), or zirconium oxide ($ZrO_2$) that is characterized by a relatively high permittivity, or layered stacks of these and other dielectric materials. The gate dielectric layer 16 may have a physical layer thickness ranging from about one (1) nm to about ten (10) nm. The dielectric material constituting the gate dielectric layer 16 may be formed by thermal reaction of the semiconductor material of the substrate 14 with a reactant, atomic layer deposition (ALD), a CVD process, a physical vapor deposition (PVD) process, or a combination of these different deposition processes.

The gate conductor layer 18 is composed of a material, such as a metal, doped polysilicon, a metal silicide, or a layered stack of these conductive materials, characterized by a significantly higher electrical conductivity than the gate dielectric layer 16. The hardmask layer 20 is composed of a dielectric material such as $Si_3N_4$ formed by a conventional deposition process, such as a CVD process. The dielectric material forming hardmask layer 20 is chosen to etch selectively to the material constituting the substrate 14. A comparatively thin pad layer (not shown) of a different dielectric material may be provided between the substrate 14 and hardmask layer 20. This optional pad layer, which is often composed of $SiO_2$ grown by wet or dry thermal oxidation of the top surface 22 of substrate 14, may operate as a buffer layer to prevent dislocations in the semiconductor material of substrate 14 caused by stresses in the hardmask layer 20.

The hardmask layer 20 is coated with a resist layer 24 composed of an organic material. The resist layer 24, which is applied by a conventional application method, is patterned by a conventional photolithography and etch process. The photolithography process entails exposing the resist layer 24 to radiation imaged using a photomask to impart a latent pattern of gate structures distributed across the top surface 22 and developing the latent pattern in the exposed resist to define residual areas of resist layer 24 that cover portions of the hardmask layer 20. The patterned resist layer 24 defines an etch mask for sequentially patterning the hardmask layer 20, gate conductor layer 18, and gate dielectric layer 16 with the etch process.

Figure 2:
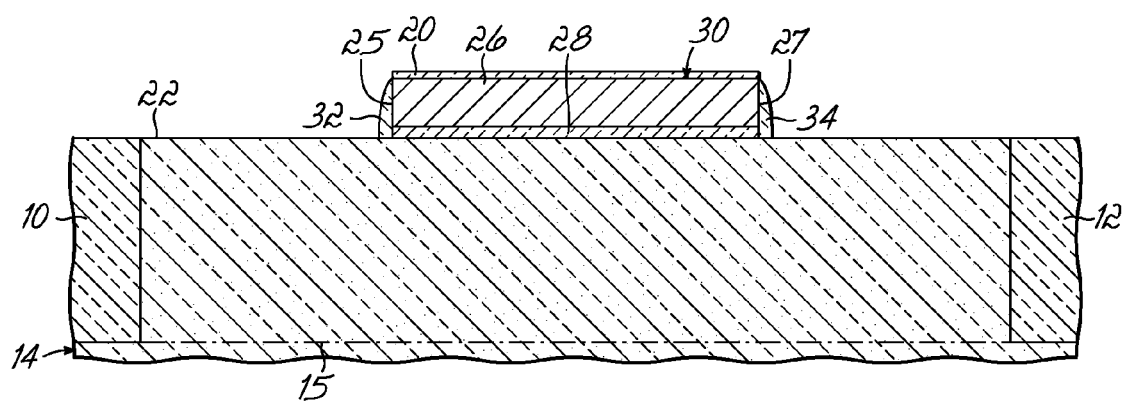

With reference to FIG. 2 in which like reference numerals refer to like features in FIG. 1 and at a subsequent fabrication stage, the gate structure pattern is subsequently transferred from the resist layer 24 (FIG. 1) to the hardmask layer 20 by an anisotropic dry etch process, such as a reactive-ion etching (RIE) process or a plasma etching process, and using the etch mask defined by the patterned resist layer 24. After the resist layer 24 is removed by ashing or solvent stripping, the gate structure pattern is subsequently transferred from the hardmask layer 20 to the gate conductor layer 18 and gate dielectric layer 16 (FIG. 1) using another anisotropic dry etch process and the patterned hardmask layer 20 as a physical etch mask. In areas of interest covered by the hardmask layer 20, the gate conductor layer 18 and gate dielectric layer 16 are left intact. In places where the hardmask layer 20 is absent, the gate conductor layer 18 and gate dielectric layer 16 are etched away.

The resulting gate electrode 26 and gate dielectric 28 of each gate structure, such as the representative gate structure 30, are situated inside the perimeter of the device region encircled by the shallow trench isolation regions 10, 12. The gate structure 30 may further includes sidewall spacers 32, 34 composed of a dielectric material, which are formed on the sidewalls 25, 27 of the gate electrode 26 and gate dielectric 28 by a conventional spacer formation process. The sidewall spacers 32, 34 may be formed by depositing a conformal layer of an electrically insulating material, such as about ten (10) nanometers to about fifty (50) nanometers of $Si_3N_4$ deposited by CVD, across the substrate 14 and anisotropic etching the conformal layer to preferentially remove the electrically insulating material from horizontal surfaces. The electrical conductivity of dielectric material in the sidewall spacers 32, 34 is substantially less than the electrical conductivity of the conductor in the gate electrode 26. The spacers 32, 34 effectively extend the location of the sidewalls 25, 27 of the gate electrode 26. In certain embodiments of the invention, the sidewall spacers 32, 34 may be omitted.

Figure 3:
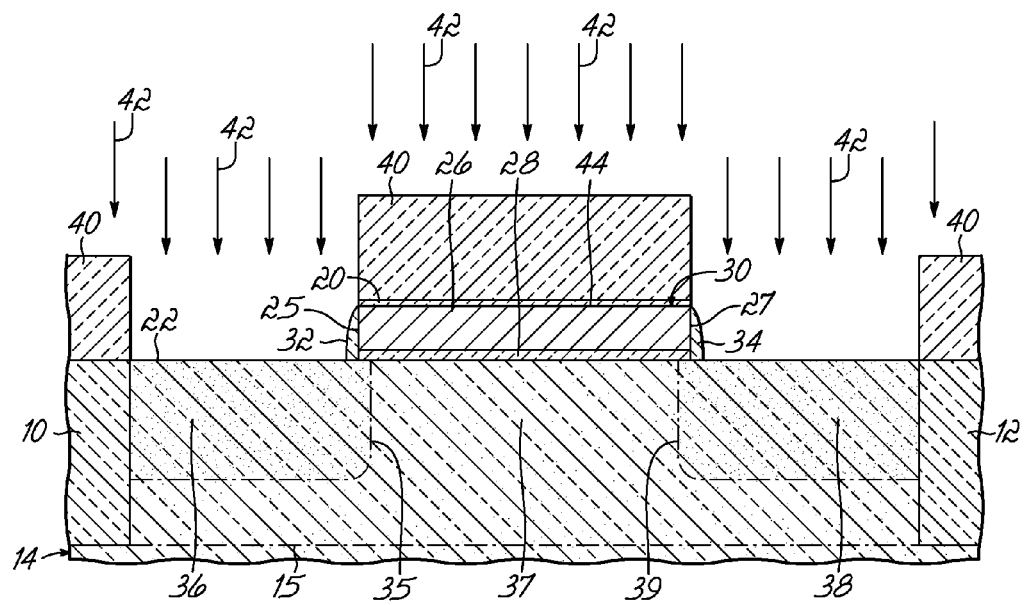

With reference to FIG. 3 in which like reference numerals refer to like features in FIG. 2 and at a subsequent fabrication stage, source and drain regions, such as the representative source region 36 and drain region 38, are formed across the substrate 14 by doping the semiconductor material of the substrate 14. A channel region 37 is disposed between the source region 36 and the drain region 38. The channel region 37, which is a portion of the well 15 and has the same conductivity type, is protected during the doping process by the overlying gate electrode 26, gate dielectric 28, and hardmask layer 20, as well as by an overlying implantation mask 40. The implantation mask 40 is formed from a photoresist layer in a manner similar to the patterned resist layer 24 (FIG. 1) and is patterned to uncover surface areas across the top surface 22 of substrate 14 for the source and drain regions 36, 38.

The source and drain regions 36, 38 may be defined using an ion implantation process that implants energetic ions, as indicated diagrammatically by the single-headed arrow 42, into the semiconductor material of the substrate 14. The resulting conductivity type of the semiconductor material of the source and drain regions 36, 38 is opposite to the conductivity type of the semiconductor material constituting the well 15. For example, the semiconductor material of the source and drain regions 36, 38 may have n-type conductivity and the semiconductor material of the well 15 may have p-type conductivity. Suitable n-type dopants in silicon are Group V elements in the Periodic Table that include, but are not limited to, arsenic and phosphorus. Alternatively, the source and drain regions 36, 38 may be doped with a suitable p-type impurity selected from Group III elements in the Periodic Table, such as boron, and the semiconductor material of the well 15 may have an n-type conductivity.

The dose of ions 42 is selected to dope the semiconductor material constituting the source and drain regions 36, 38 at an appropriate impurity concentration selected for the device design. The kinetic energy of the ions 42 and the thickness of the hardmask layer 20 and implantation mask 40 are selected such that the depth profile of the ions 42 in the hardmask layer 20 and implantation mask 40 is shallower than a top surface 44 of the gate electrode 26. Source/drain extensions and halo regions (not shown) may be provided by angled ion implantation in the semiconductor material of the substrate 14 beneath the sidewalls 25, 27 of the gate electrode 26.

The substrate 14 may be annealed to electrically activate and diffuse the implanted impurities in the source and drain regions 36, 38, as well as to repair the primary implantation damage within the source and drain regions 36, 38 from the implantations. Optionally, this anneal may be used to coalesce the point defects and inert gas atoms to form crystalline damage layers 46a, 46b, as discussed below, if the source and drain regions 36, 38 are formed after the crystalline damage layers 46a, 46b.

The net doping transitions between different conductivity types occur along a p-n junction or interface 35 for the source region 36 with the oppositely-doped well 15 and occur along a p-n junction or interface 39 for the drain region 38 with the oppositely-doped well 15. The source region 36 intersects the channel region 37 along a lateral edge of the interface 35. The drain region 38 intersects the channel region 37 along a lateral edge of the interface 39. The spacer 32 and the respective sidewall 25 of the gate electrode 26 are substantially aligned in a direction normal to the top surface 22 of substrate 14 with the lateral edge of the interface 35 between the source region 36 and the channel region 37. Similarly, the spacer 34 and the respective opposite sidewall 27 of the gate electrode 26 is substantially aligned in the direction normal to the top surface 22 of substrate 14 with the lateral edge of the interface 39 between the drain region 38 and the channel region 37. The horizontal edge of the interface 35, which at approximately the same depth relative to the top surface 22 as the horizontal edge of interface 39, extends from shallow trench isolation region 10 to a corner joining the lateral edge of the interface 35. The horizontal edge of the interface 39 extends from shallow trench isolation region 12 to a corner joining the lateral edge of the interface 39. The horizontal edges of the interfaces 35, 39 define respective intersections between the source and drain regions 36, 38 and the well 15.

Figure 4:
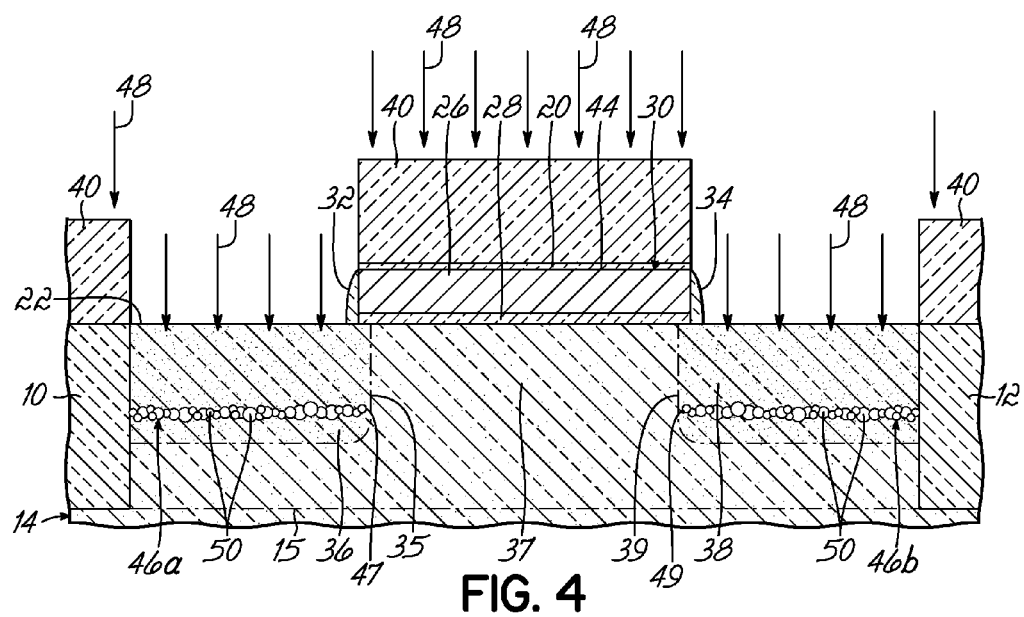

With reference to FIG. 4 in which like reference numerals refer to like features in FIG. 3 and at a subsequent fabrication stage, crystalline damage layers 46a, 46b are formed by implanting energetic ions, as indicated diagrammatically by singled-headed arrows 48, of an inert gas into the substrate 14. The inert gas used to generate the energetic ions 48 is selected to provide a neutral impurity in the semiconductor material of substrate 14. In certain embodiments, the inert gas in ions 48 and, therefore, in voids 50 may be, for example, helium or neon. The implanted dose of ions 48 is selected to promote the formation of the crystalline damage layers 46a, 46b.

The crystalline damage layers 46a, 46b are disposed at approximately the same depth beneath the top surface 22. Crystalline damage layer 46a extends horizontally from shallow trench isolation region 10 and terminates at a definite end 47 proximate to the vertical edge of the interface 35. Likewise, crystalline damage layer 46b extends horizontally from shallow trench isolation region 10 and terminates at a definite end 49 proximate to the vertical edge of the interface 35. Hence, the crystalline damage layers 46a, 46b lack continuity beneath the gate electrode 26 and are separated from each other by the channel region 37 disposed between the end 47 of crystalline damage layer 46a and the end 49 of crystalline damage layer 46b.

In the representative embodiment, the kinetic energy of the ions 48 is selected such that the depth of crystalline damage layer 46a is shallower than the horizontal edge of the interface 35 between the source region 36 and channel region 37, and such that the depth of the crystalline damage layer 46b is shallower than the horizontal edge of the interface 39 between the drain region 38 and channel region 37. In conjunction with the selection of the kinetic energy of the ions 48, the composite thickness of the hardmask layer 20 and the implantation mask 40 are chosen such that the depth profile of the ions 48 in the hardmask layer 20 and implantation mask 40 is shallower than the top surface 44 of the gate electrode 26.

The energetic ions 48 are directed to impinge the top surface 22 of the substrate 14 at normal or near-normal incidence, although the invention is not so limited. In certain embodiment, the trajectories of the ions 48 may be intentionally tilted or angled relative to the surface normal for top surface 22, which may induce a lateral non-uniform void distribution. A region with a disproportionate share of the vertically distributed voids 50 localized near the channel region 37 and within the source and drain regions 36, 38 may operated to block lateral dopant diffusion into the channel region 37.

The energetic ions 48, as they penetrate into the substrate 14, lose energy via scattering events with atoms and electrons in the constituent semiconductor material. Electronic energy losses dominate at relatively high energies and shallow depths in the substrate 14, and nuclear energy losses dominate at relatively low energies and near the projected range. Energy lost by the ions 48 in electronic interactions is subsequently transferred to phonons, which heats the semiconductor material but produces little or no permanent crystalline damage to the substrate 14. Energy lost in nuclear collisions displaces target atoms of the substrate 14 from their original lattice sites, which damages the lattice structure of the substrate 14 and causes point defects.

A band containing point defects and inert gas atoms from the stopped ions 48 extends horizontally in a plane substantially parallel to the top surface 22 of substrate 14. The point defects and inert gas atoms from the stopped ions 48 have similar depth profiles each distributed with a range straggle about a projected range, which is measured as a perpendicular distance of the maximum ion concentration and a maximum point defect peak from the top surface 22. Essentially all of the implanted ions 48 stop within a distance of three times the range straggle from the projected range, which implies that the depth profile for the point defects is spatially similar to the depth profile for the inert gas atoms.

A subsequent thermal anneal at a high temperature causes uncombined points defects and inert gas atoms of the stopped ions 48 to agglomerate and form voids 50 that are distributed across the width or thickness of the crystalline damage layers 46a, 46b. The anneal temperature and duration can be used to control the size and size distribution of the voids 50. Representative anneal temperatures are in a range of about 800° C. to about 1000° C. The thermal anneal may be executed in a non-reactive environment, such as in an argon (Ar) or nitrogen ($N_2$) atmosphere.

Although not wishing to be bound by theory, the formation of the voids 50 in the solid solution is believed to occur by a thermodynamically driven and spontaneous process known as Ostwald ripening. When the inert gas atoms from the stopped ions 48 precipitate out of the semiconductor material of the substrate 14, energetic factors will cause large precipitates to grow by drawing point defects and gas atoms from smaller precipitates, which shrink in size. The high temperature anneal promoting the agglomeration may cause the inert gas to escape from the voids 50 so that the voids 50 are unfilled by the inert gas. Of course, a portion of the voids 50 in the crystalline damage layers 46a, 46b may be unfilled by the inert gas and the remaining portion of the voids 50 may be filled at least partially by the inert gas.

The selection of ion dose, kinetic energy, and implantation angle, as well as the conditions for the thermal treatment, provide a high degree of control over the density and size of the voids 50 in the crystalline damage layers 46a, 46b. The size of the voids 50 is typically a distribution centered about an average or median value and a standard deviation. The voids 50 may be relatively small with a median size in the range of about 10 nanometers (nm) to about 50 nm. Alternatively, dependent upon the formation conditions, the voids 50 may be relatively large with a median size as large as 500 nm or larger.

The crystalline damage layers 46a, 46b disrupt the crystalline structure of the substrate 14 and are substantially non-monocrystalline or amorphous. The crystalline damage layers 46a, 46b are localized in depth within substrate 14, which reflects the extent of the depth profile for the bulk of the concentration of the implanted ions 48. The source and drain regions 36, 38 remain substantially single crystal semiconductor material between the depth of the crystalline damage layers 46a, 46b and the top surface 22 of substrate 14. These portions of the source and drain regions 36, 38 are substantially unchanged by the implantation process, as are the channel region 37 and the portion of well 15 beneath the gate structure 30 during the implantation of ions 48. The channel region 37 and the portion of well 15 beneath the gate structure 30 are also masked during the implantation of ions 42 (FIG. 3).

The crystalline damage layers 46a, 46b are each also localized laterally by the implantation mask 40, which causes the lateral extent of the crystalline damage layers 46a, 46b to be approximately self-aligned vertically with the source and drain regions 36, 38. The same implantation mask 40 is used to implant the source and drain regions 36, 38 and the crystalline damage layer 46a, 46b, which results in the self-alignment. The crystalline damage layers 46a, 46b are absent from a location in the well 15 underlying the gate electrode 26 and gate dielectric 28, which creates a discontinuity in the crystalline damage from voids 50.

Because of the commonality of the implantation mask 40 for forming the source and drain regions 36, 38 and for forming the crystalline damage layers 46a, 46b, the various embodiments of the invention may be readily incorporated into standard CMOS device processes with minimal process changes and no additional masking steps. In an alternative embodiment of the invention, ions 48 may be implanted to form the crystalline damage layers 46a, 46b before ions 42 are implanted to form the source and drain regions 36, 38 in the well 15 of substrate 14.

Although not wishing to be limited by theory, placing the crystalline damage layers 46a, 46b at a depth within the source and drain regions 36, 38 and between the top surface 22 and the horizontal edges of the interfaces 35, 39 may be effective to optimize the strain within the source and drain regions 36, 38, in comparison to greater depths for layers 46a, 46b in the substrate 14 that are outside of the source and drain regions 36, 38 and deeper in the substrate 14. Placing the crystalline damage layers 46a, 46b at a depth that coincides with the horizontal edges of the interfaces 35, 39 may not be optimum for the device structure 65 as junction leakage may be increased.

In one embodiment, the crystalline damage layers 46a, 46b are disposed outside of a depletion layer that exists when a control voltage is applied to the gate electrode 26 during operation of the device structure 65. The cross-sectional area of the depletion layer, which is usually maximized near the drain region 38, and the geometrical shape of the depletion layer is modulated by the magnitude of the applied control voltage to the gate electrode 26, which manipulates the output current from the device structure 65. This depth relationship between the crystalline damage layers 46a, 46b and the depletion layer may limit the impact of the crystalline damage layers 46a, 46b on the leakage current of the device structure 65.

Figure 4A:
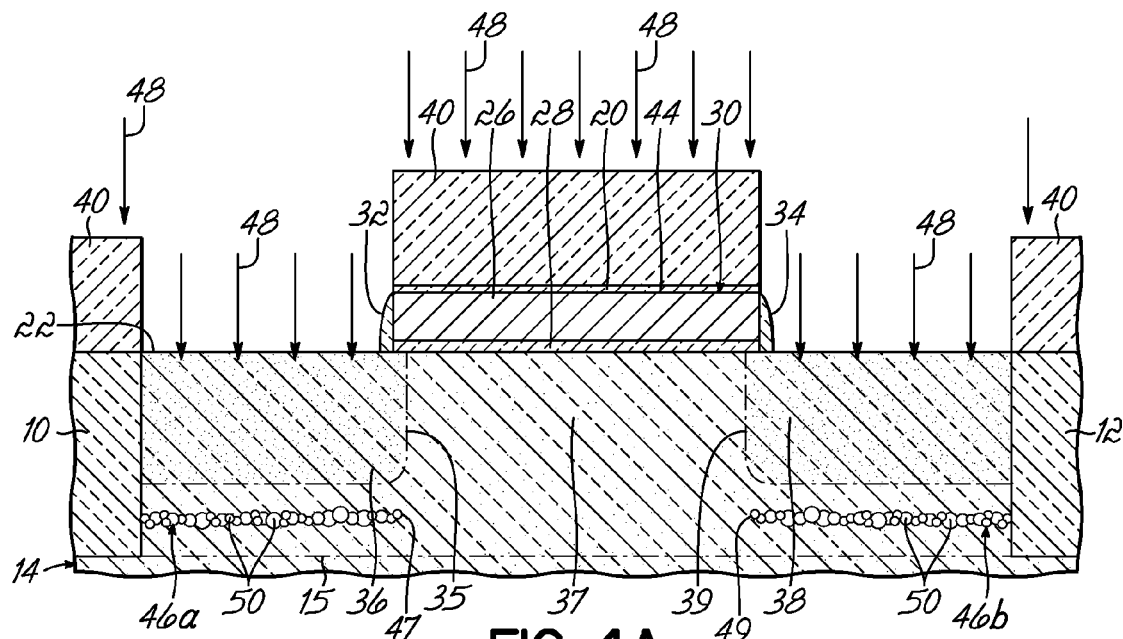
FIG. 4A is a diagrammatic cross-sectional view similar to FIG. 4 of a device structure in accordance with an alternative embodiment of the invention.

As shown in FIG. 4A in which like reference numerals refer to like features in FIG. 4 and in accordance with an alternative embodiment, the kinetic energy of the ions 48 may be chosen such that the crystalline damage layers 46a, 46b are disposed at a greater depth relative to the top surface 22 of substrate 12 than shown in FIG. 4. More specifically, through an appropriate selection of ion kinetic energy, the crystalline damage layer 46a may be located at a greater depth than the horizontal edge of the interface 35 for the source region 36. The crystalline damage layer 46b is also located at a greater depth than the horizontal edge of the interface 39 for the drain region 38. In the illustrated embodiment, the crystalline damage layers 46a, 46b are located within the well 15 and at a greater depth than the horizontal edges of the interfaces 35, 39. However, the crystalline damage layers 46a, 46b are still separated from each other by an intervening portion of the semiconductor material of the well 15 so that the crystalline damage layers 46a, 46b are discontinuous.

Although not wishing to be limited by theory, placing the crystalline damage layers 46a, 46b at greater depths in the substrate 14 than the horizontal edges of the interfaces 35, 39 for the source and drain regions 36, 38 may be effective to optimize the suppression of the soft error rate (SER) from ionizing radiation. In particular, the voids 50 constituting the crystalline damage layers 46a, 46b serve as strong recombination centers, which collectively operate to reduce charge collection by the drain region 38 arising from electron-hole pairs formed along tracks of ionization radiation, such as cosmic rays, traversing the device structure 65.

Figure 4B:
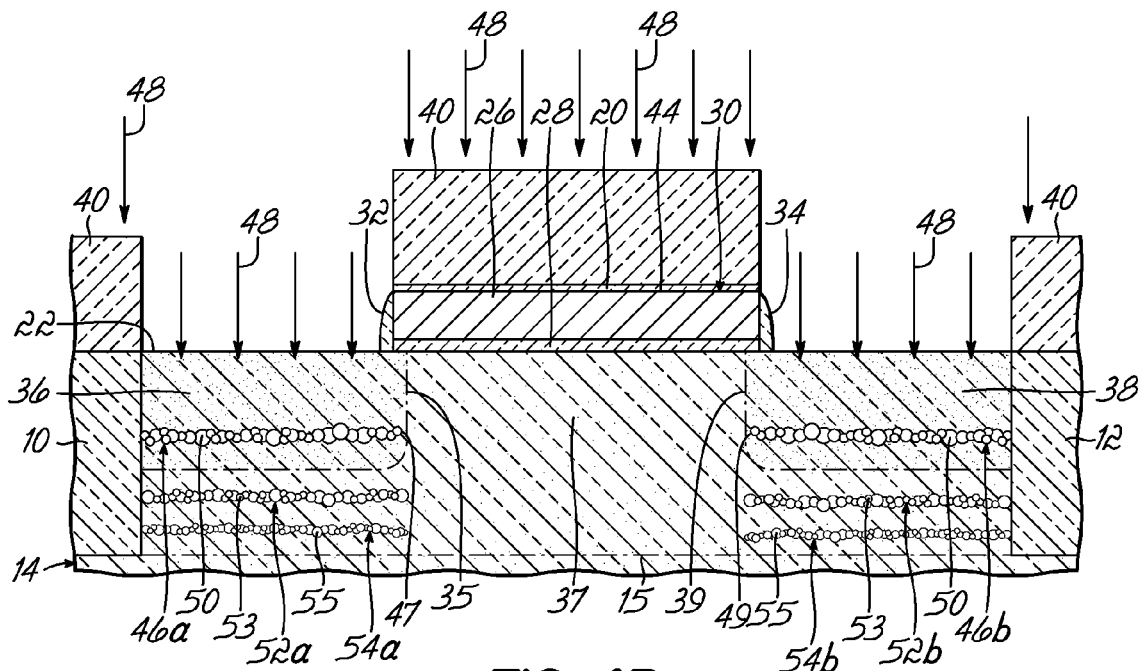
FIG. 4B is a diagrammatic cross-sectional view similar to FIG. 4 of a device structure in accordance with an alternative embodiment of the invention

As shown in FIG. 4B in which like reference numerals refer to like features in FIG. 4 and in accordance with an alternative embodiment, additional crystalline damage layers 52a, 52b and crystalline damage layers 54a, 54b may be formed at different depths in the substrate 14. Each set of crystalline damage layers 52a, 52b and crystalline damage layers 54a, 54b are similar to crystalline damage layers 46a, 46b but located at different depths. In the representative alternative embodiment, crystalline damage layers 52a, 54a are located at greater depths below the source region 36 than crystalline damage layer 46a and crystalline damage layer 52a is at a more shallow depth than crystalline damage layer 54a. Similarly, crystalline damage layers 52b, 54b are located at greater depths below the drain region 38 than crystalline damage layer 46b with crystalline damage layer 52b between crystalline damage layer 54b and crystalline damage layer 46b.

In another alternative embodiment, crystalline damage layers 54a, 54b may be omitted from the device construction so that only crystalline damage layers 46a, 46b contained within the source and drain regions 36, 38 and crystalline damage layers 52a, 52b separated from the top surface 22 by the source and drain regions 36, 38 are present. Alternatively, additional sets of crystalline damage layers (not shown) may be added to the device construction that includes crystalline damage layers 46a, 46b, 52a, 52b, 54a, 54b.

The different depths relative to the top surface 22 of substrate 14 for the crystalline damage layers 52a, 52b and crystalline damage layers 54a, 54b, as well as crystalline damage layers 46a, 46b, are produced by selecting a unique ion kinetic energy for each of the different ion implantation processes. The ion doses for the different sets of crystalline damage layers 46a, 46b, crystalline damage layers 52a, 52b, and crystalline damage layers 54a, 54b, as well as the anneal temperature, may also be selected to engineer the characteristics of the voids 50, 53, 55, such as density and size. In the representative embodiment, the size of voids 55 in crystalline damage layers 54a, 54b is less than the size of voids 53 in crystalline damage layers 52a, 52b, which is less than the size of the size of the voids 50 in crystalline damage layers 46a, 46b. The crystalline damage layers 52a, 52b are discontinuous and separated from each other by an intervening portion of the semiconductor material of the well 15. Similarly, the crystalline damage layers 54a, 54b lack continuity and spaced apart by another intervening portion of the semiconductor material of the well 15.

Even in these alternative embodiments of FIGS. 4A, 4B, the commonality of the implantation mask 40 for forming the source and drain regions 36, 38 and for forming the crystalline damage layers 46a, 46b, 52a, 52b, 54a, 54b permits multiple cascading, self-aligned implantations at different kinetic energies to be readily incorporated into standard CMOS device processes. The incorporation is permitted with minimal process changes and with no additional masking steps. Although not wishing to be limited by theory, placing crystalline damage layers 46a, 46b at a relatively shallow depth within the source and drain regions 36, 38 and placing crystalline damage layers 52a, 52b and crystalline damage layers 54a, 54b at greater depths in the substrate 14 than the source and drain regions 36, 38 may be effective to simultaneously optimize the strain within the source and drain regions 36, 38 and SER suppression.

Figure 5:
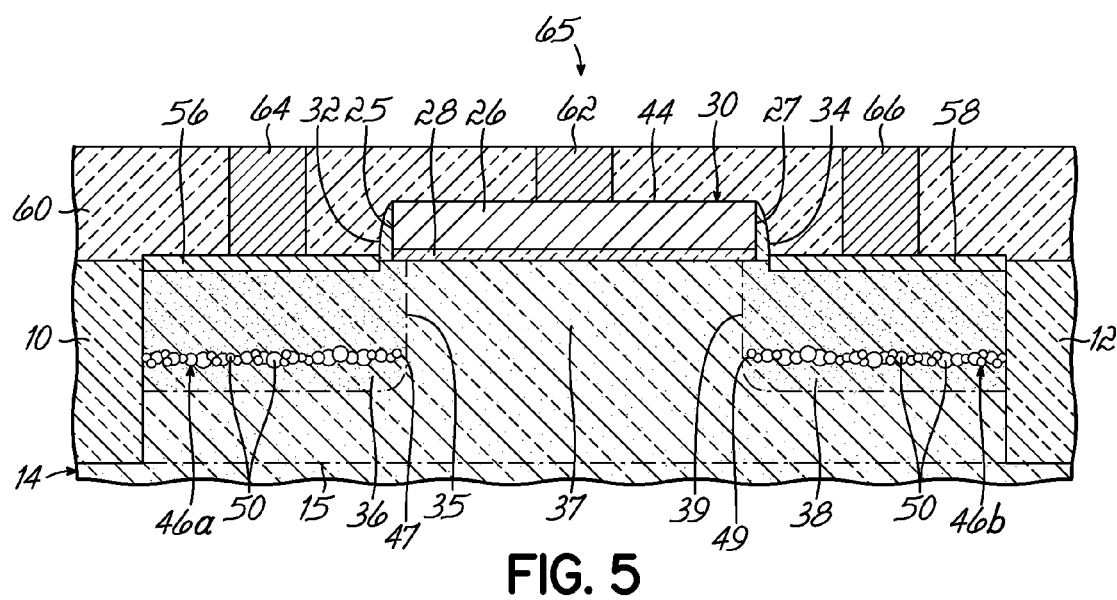

With reference to FIG. 5 in which like reference numerals refer to like features in FIG. 4 and at a subsequent fabrication stage, the implantation mask 40 and hardmask layer 20 (FIG. 4) are respectively removed by, for example, a solvent and a wet chemical etch from the top surface 22 of the substrate 14.

The gate electrode 26, gate dielectric 28, source and drain regions 36, 38, and channel region 37 constitute a device structure 65, which further includes the crystalline damage layers 46a, 46b. The gate dielectric 28 separates the gate electrode 26 from the channel region 37 so that the gate electrode 26 is not in direct electrical contact with the substrate 14. The channel region 37, which constitutes a portion of the well 15 protected when the source and drain regions 36, 38 are formed, is juxtaposed laterally on one side by the source region 36 and on the opposite side by the drain region 38. In the representative embodiment, the channel region 37 is contiguous with the source and drain regions 36, 38.

In one embodiment, the device structure 65 may be an n-channel field effect transistor in which the well 15 is a p-well, the channel region 37 is defined in the p-well, and the source and drain regions 36, 38 consist of semiconductor material of the substrate 14 that is doped n-type. Alternatively, the device structure 65 may be a p-channel field effect transistor in which the well 15 that is an n-well, the channel region 37 is defined in the n-well, and the source and drain regions 36, 38 consist of semiconductor material of the substrate 14 that is doped p-type. In one embodiment, device structures 65 that are p-channel and device structures 65 that are n-channel field effect transistors may be fabricated on substrate 14 to form CMOS pairs as understood by a person having ordinary skill in the art The volume expansion of the source region 36 caused by the voids 50 in the crystalline damage layer 46a and the volume expansion of the drain region 38 caused by the voids 50 in the crystalline damage layer 46b applies a force to the semiconductor material in the source and drain regions 36, 38 that is transferred to the channel region. The compressive stress is transferred from the source and drain regions 36, 38 to the channel region 37 of the device structure 65. If the device structure 65 is a p-channel field effect transistor, the compressive stress, which may be as high as several megapascals, applied to the channel region 37 operates to improve hole mobility and, therefore, operates to enhance device speed and performance. The characteristics of the voids 50 may be engineered to tailor the magnitude of the compressive stress transferred from the crystalline damage layers 46a, 46b to the channel region 37.

The self-aligned process forms the crystalline damage layers 46a, 46b only beneath the source and drain regions 36, 38 and without substantial lateral encroachment into the well 15 beneath the gate structure 30. As a result, the impact of the crystalline damage on the channel region 37 of the device structure 65 is minimized compared to a conventional approach that provides a continuous damage layer buried in the substrate 14. Of course, lateral range straggle and other physical phenomena may cause the crystalline damage layers 46a, 46b to penetrate for a short distance laterally into the channel region 37 or, more generally, the portion of the well 15 vertically beneath the gate structure 30. In any event, the crystalline damage layers 46a, 46b do not extend laterally for a significant distance beneath the gate structure 30 defined by the gate electrode 26 and gate dielectric 28 and, as a result, the crystalline damage layers 46a, 46b lack any type of continuity beneath the gate structure 30.

The voids 50 constituting the crystalline damage layers 46a, 46b may also beneficially provide metal gettering, as well as mid-band gap traps effective for local carrier lifetime control. In addition, the crystalline damage layers 46a, 46 may be effective to reduce or prevent diffusion of dopant out of the source and drain regions 36, 38, which may represent a significant problem for device structures 65 characterized by shallow junctions with limited doping levels. If not mitigated by the presence of the crystalline damage layers 46a, 46, outward diffusion of the dopant actually places a lower limit on the ability to fabricate a shallow junction. Angled implantations of ions 48 may cause the voids 50 to have a laterally non-uniform distribution. By maintaining the overall doping level in the source and drain regions 36, 38 because of the presence of the crystalline damage layers 46a, 46 to block diffusion and mitigate against dopant loss, device performance may be improved in shallow junction device structures.

Conductive layers 56, 58 are respectively formed near the top surface 22 of the substrate 14 in the source and drain regions 36, 38. The conductive layers 56, 58 may be composed of a silicide material formed by a conventional silicidation process familiar to a person having ordinary skill in the art. A dielectric layer 60 for a local interconnect (M1) metallization level is applied on the top surface 22 of the substrate 14. Contacts 62, 64, 66, which are formed in the dielectric layer 60, are coupled electrically with the gate electrode 26 and the conductive layers 56, 58 on the source and drain regions 36, 38. Standard processing follows, which includes the formation of interlayer dielectric layers, conductive vias, and metallization included in upper metallization levels (M2-level, M3-level, etc.) of a back-end-of-line (BEOL) wiring structure coupled with the contacts 62, 64, 66 and other similar contacts for additional device structures 65.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the structures herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device structure formed in a substrate of a semiconductor material having a top surface, the device structure comprising:
    a first doped region of a first conductivity type defined within the semiconductor material of the substrate;
    a second doped region of the first conductivity type defined within the semiconductor material of the substrate;
    a third doped region disposed within the semiconductor material of the substrate laterally between the first doped region and the second doped region and continuously extending laterally beneath the first doped region and the second doped region, the semiconductor material of the third doped region having a second conductivity type opposite to the first conductivity type;
    a gate structure that directly contacts the top surface of the substrate, the gate structure having a vertically stacked relationship with the third doped region;
    a first crystalline damage layer within the first doped region of the substrate, the first crystalline damage layer including a first plurality of voids surrounded by the semiconductor material of the substrate,
    wherein at least a portion of the first doped region is disposed vertically between the first crystalline damage layer and the top surface of the substrate, and the first crystalline damage layer does not extend laterally for a significant distance beneath the gate structure;
    a third crystalline damage layer within the third doped region of the substrate, the third crystalline damage layer including a third plurality of voids surrounded by the semiconductor material of the substrate,
    wherein at least a portion of the third doped region is disposed vertically between the third crystalline damage layer and a bottom the first region, and the third crystalline damage layer does not extend laterally for a significant distance beneath the gate structure.

2. The device structure of claim 1 wherein at least a fraction of the first plurality of voids contains an inert gas.

3. The device structure of claim 1 wherein the second conductivity type is p-type conductivity so that the semiconductor material in the third doped region has the p-type conductivity, and the first crystalline damage layer is effective to transfer compressive stress to the third doped region.

4. The device structure of claim 1 wherein the third doped region is juxtaposed with the first doped region so as to intersect the first doped region along an interface, and the first crystalline damage layer terminates at an end having an approximately vertically aligned relationship with a vertical portion of the interface.

5. The device structure of claim 1 wherein the first doped region is a drain of a field effect transistor, the second doped region is a source of the field effect transistor, and the gate structure includes a gate electrode and a gate dielectric layer separating the gate electrode from the top surface of the substrate.

6. The device structure of claim 1 wherein the first doped region is disposed vertically between the first crystalline damage layer and the top surface.

7. The device structure of claim 1 further comprising:
a second crystalline damage layer within the semiconductor material of the substrate, the second crystalline damage layer including a second plurality of voids surrounded by the semiconductor material of the substrate,
wherein at least a portion of the second doped region is disposed vertically between the second crystalline damage layer and the top surface of the substrate.

8. The device structure of claim 7 wherein the second crystalline damage layer is separated from the first crystalline damage layer by a portion of the third doped region such that the first and second crystalline damage layers are discontinuous.

9. The device structure of claim 1 wherein the gate structure includes a first sidewall, and the first crystalline damage layer terminates at an end disposed in an approximately vertical alignment with the first sidewall of the gate structure.

10. The device structure of claim 9 wherein the gate structure has a second sidewall opposite to the first sidewall, and further comprising:
a second crystalline damage layer within the semiconductor material of the substrate, the second crystalline damage layer including a second plurality of voids surrounded by the semiconductor material of the substrate the second crystalline damage layer disposed vertically between at least a portion the second doped region and the top surface of the substrate, and
the second crystalline damage layer has a terminal end disposed in an approximately vertical alignment with the second sidewall of the gate structure.

11. The device structure of claim 10 wherein the second crystalline damage layer is separated from the first crystalline damage layer by a portion of the third doped region such that the first and second crystalline damage layers are discontinuous.

12. The device structure of claim 9 wherein the first doped region and the third doped region intersect along a p-n junction, and the end of the first crystalline damage layer is in an approximately lateral alignment with the p-n junction.

13. A method of fabricating a device structure in a substrate composed of a semiconductor material, the method comprising:
forming a first doped region of a first conductivity type in the semiconductor material of the substrate;
forming a second doped region of the first conductivity type in the semiconductor material and laterally separated from the first doped region by a third doped region having a second conductivity type opposite to the first conductivity type, wherein the third doped region further extends continuously and laterally beneath the first doped region and the second doped region;
forming a gate structure on a top surface of the substrate that has a vertically stacked relationship with the third doped region;
forming a first plurality of voids surrounded by the semiconductor material of the substrate to define a first crystalline damage layer that is separated from the top surface of the substrate by at least a portion of the first doped region and that does not extend laterally for a significant distance into the third doped region;
forming a third plurality of voids surrounded by the third doped region to define a third crystalline damage layer that is separated from a bottom of the first region by at least a portion of the third doped region and that does not extend laterally for a significant distance beneath the gate structure; and
forming a fourth plurality of voids surrounded by the third doped region to define a fourth crystalline damage layer that is separated from a bottom of the second doped region by at least a portion of the third doped region and that does not extend laterally for a significant distance beneath the gate structure;
wherein the third crystalline damage layer and the fourth crystalline layer are separated by a portion of the third doped region such that the third and fourth crystalline damage layers are discontinuous.

14. The method of claim 13 wherein forming the first plurality of voids further comprises:
implanting a first plurality of ions of an inert gas into the substrate at a first kinetic energy and with a first dose; and
annealing the substrate to agglomerate point defects generated in the semiconductor material by the first plurality of ions into the first plurality of voids.

15. The method of claim 14 wherein atoms of the inert gas from the implanted first plurality of ions are agglomerated into the first plurality of voids along with the point defects so that at least a fraction of the first plurality of voids contains one or more atoms of the inert gas.

16. The method of claim 14 wherein the gate structure is formed on the top surface of the substrate, and further comprising:
applying a resist layer on the gate structure and the top surface;
patterning the resist layer to expose a first area of the top surface overlying the first doped region; and
during the implantation of the first plurality of ions of the inert gas, using the gate structure and the resist layer as an implantation mask covering the third doped region so that a terminal end of the first crystalline damage layer is approximately aligned in a vertical direction with a first sidewall of the gate structure.

17. The method of claim 16 further comprising:
using the implantation mask, implanting a second plurality of ions of the inert gas into the substrate at a second kinetic energy different than the first kinetic energy and with a second dose to form a second plurality of voids defining a second crystalline damage layer that has a terminal end approximately aligned in the vertical direction with the first sidewall of the gate structure and that is separated from the top surface of the substrate by at least a portion of the first doped region.

18. The method of claim 16 wherein the resist layer is patterned to expose a second area of the top surface overlying the second doped region, and further comprising:

permitting a portion of the first plurality of ions of the inert gas to penetrate through the second area of the top surface into the second doped region and form a second plurality of voids defining a second crystalline damage layer that has a terminal end approximately aligned with a second sidewall of the gate structure and that is laterally separated from the first crystalline damage layer by the third doped region.

19. The method of claim 16 wherein forming the first doped region of the first conductivity type further comprises:

using the implantation mask, implanting a plurality of ions of an impurity species into the semiconductor material of the substrate to dope the semiconductor material of the substrate in the first doped region.

* * * * *